(12) United States Patent
Kim et al.

(10) Patent No.: US 9,806,137 B2
(45) Date of Patent: Oct. 31, 2017

(54) DISPLAY SUBSTRATES, METHODS OF MANUFACTURING THE SAME AND DISPLAY DEVICES INCLUDING THE SAME

(71) Applicant: Samsung Display Co., Ltd., Yongin-si (KR)

(72) Inventors: Sung-Ho Kim, Yongin-si (KR); Jong-Moo Huh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/354,041

(22) Filed: Nov. 17, 2016

(65) Prior Publication Data

US 2017/0069699 A1    Mar. 9, 2017

Related U.S. Application Data

(62) Division of application No. 14/924,317, filed on Oct. 27, 2015, now Pat. No. 9,525,074.

(30) Foreign Application Priority Data

Jan. 29, 2015    (KR) .................... 10-2015-0013949

(51) Int. Cl.
*H01L 21/00* (2006.01)
*H01L 27/32* (2006.01)
*H01L 29/786* (2006.01)
*H01L 29/66* (2006.01)
*H01L 51/56* (2006.01)

(52) U.S. Cl.
CPC ...... *H01L 27/3248* (2013.01); *H01L 27/3223* (2013.01); *H01L 27/3258* (2013.01); *H01L 27/3262* (2013.01); *H01L 27/3276* (2013.01); *H01L 29/66969* (2013.01); *H01L 29/7869* (2013.01); *H01L 29/78606* (2013.01); *H01L 51/56* (2013.01); *H01L 27/3265* (2013.01); *H01L 2227/323* (2013.01)

(58) Field of Classification Search
CPC ............. H01L 27/3248; H01L 27/3223; H01L 27/3262; H01L 27/3265
USPC ........................................ 438/151
See application file for complete search history.

(56) References Cited

U.S. PATENT DOCUMENTS 7,910,919 B2    3/2011   Yang et al.

FOREIGN PATENT DOCUMENTS

KR      100788545     12/2007
KR     1020110066805    6/2011
(Continued)

OTHER PUBLICATIONS

Notice of Allowance dated Aug. 12, 2016, in U.S. Appl. No. 14/924,317.

*Primary Examiner* — Anthony Ho
(74) *Attorney, Agent, or Firm* — H.C. Park & Associates, PLC

(57) ABSTRACT

A display substrate includes a base substrate, a switching device on the base substrate and an alignment pattern. The switching device includes an active pattern, a gate insulation layer pattern partially covering the active pattern, a gate electrode on the gate insulation layer pattern, and a source electrode and a drain electrode electrically connected to the active pattern. The alignment pattern has a multi-layered structure and is spaced apart from the switching device on the base substrate. The alignment pattern includes materials which have different transmittances.

4 Claims, 6 Drawing Sheets

(56) References Cited

FOREIGN PATENT DOCUMENTS

| | | |
|---|---|---|
| KR | 1020120070709 | 7/2012 |
| KR | 1020140061899 | 5/2014 |

DISPLAY SUBSTRATES, METHODS OF MANUFACTURING THE SAME AND DISPLAY DEVICES INCLUDING THE SAME

CROSS-REFERENCE TO RELATED APPLICATION

This application is a divisional of U.S. application Ser. No. 14/924,317, filed on Oct. 27, 2015, which claims priority from and the benefit of Korean Patent Application No. 10-2015-0013949, filed on Jan. 29, 2015, each of which is hereby incorporated by reference for all purposes as if fully set forth herein.

BACKGROUND

Field

Exemplary embodiments relate to display substrates, methods of manufacturing the same and display devices including the same. More particularly, exemplary embodiments relate to display substrates including alignment patterns, methods of manufacturing the same and display devices including the same.

Discussion of the Background

Various structures including a thin film transistor (TFT), insulative layers such as a gate insulation layer, wiring, etc., may be formed on a substrate of a display device, e.g., an organic light emitting display (OLED) device. A plurality of photo-lithography processes may be performed for the formation of the structures. As the number of the photo-lithography processes increase, the cost of the process may also increase and a high degree of process accuracy may be needed.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display substrate having an improved process efficiency.

Exemplary embodiments also provide a method of manufacturing a display substrate by an improved process efficiency.

Exemplary embodiments further provide a display device having an improved process efficiency.

Additional aspects will be set forth in the detailed description which follows, and, in part, will be apparent from the disclosure, or may be learned by practice of the inventive concept.

An exemplary embodiment discloses a display substrate that includes a base substrate, a switching device on the base substrate and an alignment pattern. The switching device includes an active pattern, a gate insulation layer pattern partially covering the active pattern, a gate electrode on the gate insulation layer pattern, and a source electrode and a drain electrode electrically connected to the active pattern. The alignment pattern has a multi-layered structure and is spaced apart from the switching device on the base substrate. The alignment pattern includes materials which have different transmittances.

An exemplary embodiment also discloses a method of manufacturing a display substrate. In the method, a base substrate including a first region and a second region is provided. A dummy layer, a buffer layer and an active layer are formed sequentially on the base substrate. The active layer, the buffer layer and the dummy layer are partially etched such that a first dummy pattern, a first buffer layer pattern and an active pattern sequentially stacked on the base substrate are formed on the first region, and a second dummy pattern, a second buffer layer pattern and a dummy active pattern sequentially stacked on the base substrate are formed on the second region. A gate insulation layer covering the active pattern and the dummy active pattern is formed on the base substrate. A gate electrode which is superimposed over the active pattern is formed on the gate insulation layer. The gate insulation layer is partially etched using the gate electrode as an etching mask. An insulating interlayer covering the gate electrode and the dummy active pattern is formed on the base substrate. A source electrode and a drain electrode electrically connected to the active pattern are formed through the insulating interlayer.

An exemplary embodiment further discloses a display device that includes a base substrate including a first region and a second region, a switching device on the first region of the base substrate, an alignment pattern on the second region of the base substrate, a pixel electrode electrically connected to the switching device on the first region, a display layer on the pixel electrode, and an opposing electrode facing the pixel electrode with respect to the display layer. The alignment pattern includes a lower pattern and an upper pattern. The upper pattern has a transmittance greater than that of the lower pattern.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
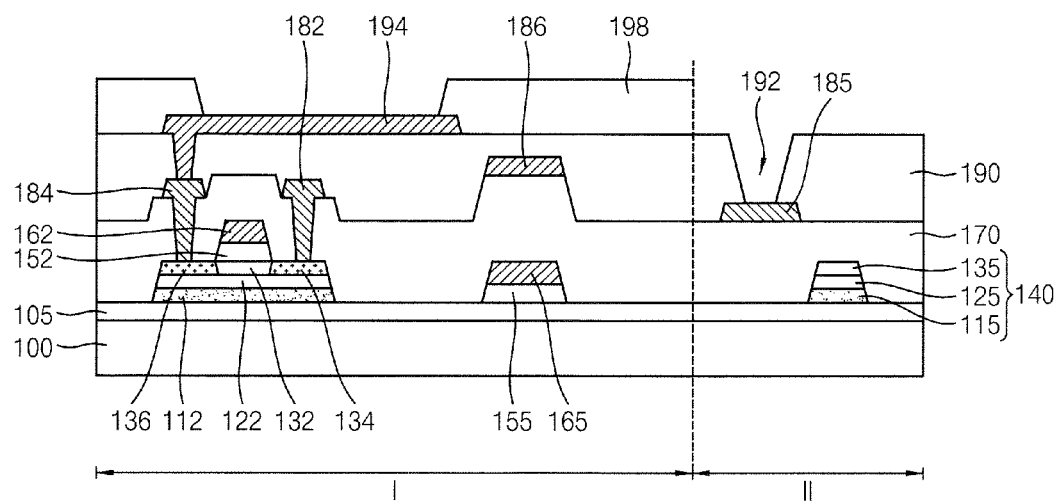
FIG. 1 is a cross-sectional view illustrating a display substrate in accordance with an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view illustrating a display substrate in accordance with an exemplary embodiment. For example, the display substrate may serve as a back-plane (BP) substrate of a display device such as an organic light emitting display (OLED) device or a liquid crystal display (LCD) device.

The display substrate may include a switching device, a capacitor, a pad 185, an alignment pattern 140, and a pixel electrode 194 on a base substrate 100.

In an exemplary embodiment, the switching device may include a top gate type thin film transistor (TFT) including an oxide semiconductor.

The base substrate 100 may be divided into a display region I and a wiring region II. In some embodiments, the wiring region II may be defined at a peripheral portion of the display region I. In some embodiments, the display region I may be surrounded by the wiring region II.

The switching device, the capacitor, and the pixel electrode 194 may be disposed on the display region I of the base substrate 100, and the pad 185 and the alignment pattern 140 may be disposed on the wiring region II.

The base substrate 100 may include a transparent insulation substrate. For example, a glass substrate, a transparent plastic substrate including, e.g., polyethylene terephthalate (PET), polyethylene naphthalate (PEN) or polyimide, or a transparent metal oxide substrate. If the base substrate 100 includes a polymer resin such as polyimide, the base substrate 100 may have a flexible property.

A barrier layer 105 may be formed on the base substrate 100. Diffusion of moistures and/or impurities between the base substrate 100 and structures thereon may be blocked by the barrier layer 105. The barrier layer 105 may include, e.g., silicon oxide, silicon nitride, and/or silicon oxynitride. In some embodiments, the barrier layer 105 may be omitted.

A first dummy pattern 112, an insulation pattern 155 and a second dummy pattern 115 may be disposed on the barrier layer 105. The first dummy pattern 112 and the insulation pattern 155 may be disposed on the display region I of the base substrate 100, and the second dummy pattern 115 may be disposed on the wiring region II of the base substrate 100.

In an exemplary embodiment, the first dummy pattern 112 and the second dummy pattern 115 may include a material substantially the same as or similar to each other. In some embodiments, the first dummy pattern 112 and the second dummy pattern 115 may include a silicon compound such as polysilicon or amorphous silicon. In some embodiments, the first dummy pattern 112 and the second dummy pattern 115 may include a metal. The insulation pattern 155 may include silicon oxide, silicon nitride, and/or silicon oxynitride.

A first buffer layer pattern 122 and a second buffer layer pattern 125 may be disposed on the first dummy pattern 112 and the second dummy pattern 115, respectively.

In an exemplary embodiment, the first buffer layer pattern 122 and the second buffer layer pattern 125 may include an insulative material such as silicon oxide, silicon nitride, and/or silicon oxynitride. In some embodiments, the first buffer layer pattern 122 and the second buffer layer pattern 125 may have a multi-layered structure of a silicon oxide layer and a silicon nitride layer.

An active pattern 132 and a dummy active pattern 135 may be disposed on the first buffer layer pattern 122 and the second buffer layer pattern 125.

In an exemplary embodiment, the active pattern 132 may include the oxide semiconductor. For example, the active pattern 132 may include indium gallium zinc oxide (IGZO), zinc tin oxide (ZTO), or indium tin zinc oxide (ITZO).

A first contact region 134 and a second contact region 136 may be formed at both ends of the active pattern 132. The first contact region 134 and the second contact region 136 may have a relatively low resistance, and may have a relatively greater hydrogen content.

The dummy active pattern 135 may include a material substantially the same as or similar to that of the active pattern 132. In an exemplary embodiment, the dummy active pattern 135 may include an oxide semiconductor such as IGZO, ZTO, or ITZO.

Accordingly, the alignment pattern 140 including the second dummy pattern 115, the second buffer layer pattern 125 and the dummy active pattern 135 sequentially stacked on the barrier layer 105 may be formed on the wiring region II of the base substrate 100.

A gate insulation layer pattern 152 may be disposed on the active pattern 132. The gate insulation layer pattern 152 may include a material substantially the same as or similar to that of the insulation pattern 155. For example, the gate insulation layer pattern 152 may include silicon oxide, silicon nitride, and/or silicon oxynitride.

A gate electrode 162 and a lower electrode 165 may be disposed on the gate insulation layer pattern 152 and the insulation pattern 155, respectively.

The gate electrode 162 may be substantially superimposed over the active pattern 132 with respect to the gate insulation layer pattern 152.

The gate electrode 162 and the lower electrode 165 may include a conductive material substantially the same as or similar to each other. For example, the gate electrode 162 and the lower electrode 165 may include a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) and scandium (Sc), an alloy thereof, or a nitride thereof. These may be used alone or in a combination thereof. In an embodiment, the gate electrode 162 and the lower electrode 165 may include a multi-stacked structure, e.g., an Al/Mo structure or a Ti/Cu structure so that an electrical resistance may be reduced.

An insulating interlayer 170 may be formed on the barrier layer 105, and may cover the active pattern 132, the contact regions 134 and 136, the gate electrode 162, the lower electrode 165 and the alignment pattern 140. The insulating interlayer 170 may be commonly provided on the display region I and the wiring region II.

The insulating interlayer 170 may include silicon oxide, silicon nitride, and/or silicon oxynitride. In some embodiments, the insulating interlayer 170 may have a multi-layered structure including a silicon oxide layer and a silicon nitride layer.

The insulating interlayer 170 may include protrusions formed at regions covering the contact regions 134 and 136, the gate electrode 162 and the lower electrode 165. In some embodiments, the insulating interlayer 170 may have a sufficient thickness and may have a substantially planar or leveled top surface.

A source electrode 182, a drain electrode 184, an upper electrode 186, and the pad 185 may be disposed on the insulating interlayer 170.

The source electrode 182 and the drain electrode 184 may extend through the insulating interlayer 170 to be in contact with or electrically connected to the first contact region 134 and the second contact region 136, respectively.

The upper electrode 186 may be substantially superimposed over the lower electrode 165 with respect to the insulating interlayer 170. The pad 185 may be disposed on the wiring region II of the base substrate 100.

The source electrode 182, the drain electrode 184, the upper electrode 186, and the pad 185 may include a conductive material substantially the same as or similar to each other. For example, the source electrode 182, the drain electrode 184, the upper electrode 186, and the pad 185 may include a metal such as Al, Ag, W, Cu, Ni, Cr, Mo, Ti, Pt, Ta, Nd or Sc, an alloy, or a metal nitride. These may be used alone or in a combination thereof. In some embodiments, the source electrode 182, the drain electrode 184, the upper electrode 186, and the pad 185 may have a multi-layered structure including, e.g., an Al layer and a Mo layer.

In some embodiments, the source electrode 182 may be connected to or integral with a data line (not illustrated). The gate electrode 162 may be connected to or integral with a scan line (not illustrated).

Accordingly, the TFT including the active pattern 132, the contact regions 134 and 136, the gate insulation layer pattern 152 and the gate electrode 162 may be defined on the display region I, and the switching device may be defined by the TFT together with the source electrode 182 and the drain electrode 184.

The capacitor may be defined by the lower electrode 165, the insulating interlayer 170 and the upper electrode 186. The capacitor may be electrically connected to the switching device.

For example, each pixel in the display region I may be defined at each intersection region of the data lines and the scan lines. FIG. 1 illustrates one TFT, however, a plurality of the TFTs may be formed at the each pixel. For example, a switching TFT, a driving TFT, and the capacitor may be formed at the each pixel.

A via insulation layer 190 covering the source electrode 182, the drain electrode 184, the upper electrode 186 and the pad 185 may be formed on the insulating interlayer 170. The via insulation layer 190 may be provided commonly on the display region I and the wiring region II.

A via structure by which the drain electrode 184 and the pixel electrode 194 may be electrically connected to each other may be accommodated in the via insulation layer 190. The via insulation layer 190 may have a substantially leveled top surface.

For example, the via insulation layer 190 may include a transparent organic material such as polyimide, an epoxy-based resin, an acryl-based resin, or a polyester-based resin.

The pixel electrode 194 may be disposed on the via insulation layer 190, and may include the via structure extending through the via insulation layer 190 to be electrically connected to the drain electrode 184.

The pixel electrode 194 may include a metal such as Al, Ag, W, Cu, Ni, Cr, Mo, Ti, Pt, Ta, Nd or Sc, and/or an alloy of the metal. In an embodiment, the pixel electrode 194 may include a transparent conductive material having a high work function. For example, the pixel electrode 194 may include indium tin oxide (ITO), indium zinc oxide (IZO), zinc oxide, or indium oxide.

A pixel defining layer (PDL) 198 may be formed on the via insulation layer 190, and may cover a peripheral portion of the pixel electrode 194. The PDL 198 may include a transparent organic material such as polyimide or an acryl-based resin, or an inorganic insulative material. The PDL 198 may be disposed selectively on the display region I.

A portion of the via insulation layer 190 formed on the wiring region II may include an interconnection hole 192. A top surface of the pad 185 may be at least partially exposed through the interconnection hole 192.

According to an exemplary embodiment described above, the alignment pattern 140 may include the second dummy pattern 115, the second buffer layer pattern 125 and the dummy active pattern 135 sequentially stacked from the base substrate 100. The alignment pattern 140 may serve as an align-key while forming elements included in the TFT and the capacitor on the display region I. The alignment pattern 140 may be formed using materials and processes substantially the same as or similar to those for the first dummy pattern 112, the first buffer layer pattern 122, and the active pattern 132. Therefore, a process efficiency may be improved.

FIGS. 2 to 11 are cross-sectional views illustrating a method of manufacturing a display substrate in accordance with an exemplary embodiment. For example, FIGS. 2 to 11 illustrate a method of manufacturing a display substrate of FIG. 1.

Figure 2:
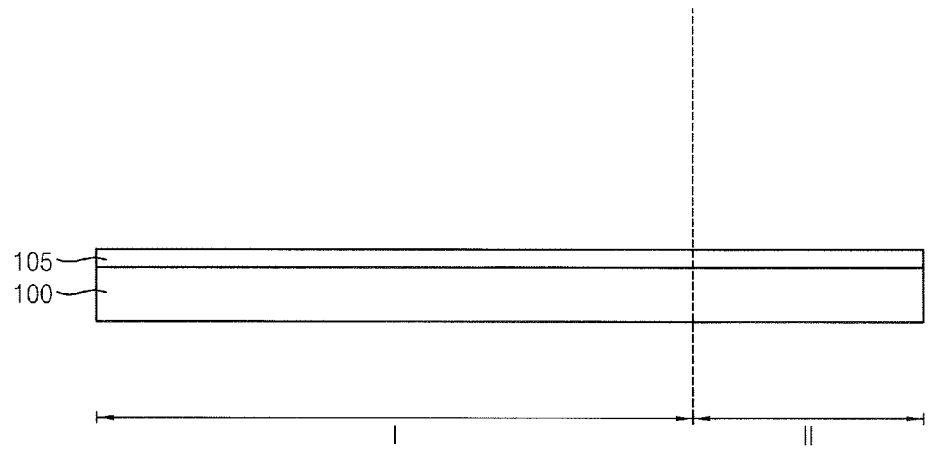
FIGS. 2, 3, 4, 5, 6, 7, 8, 9, 10, and 11 are cross-sectional views illustrating a method of manufacturing a display substrate in accordance with an exemplary embodiment.

Referring to FIG. 2, a barrier layer 105 may be formed on a base substrate 100.

A glass substrate, a transparent plastic substrate including PET, PEN, or polyimide, or a transparent metal oxide substrate may be used as the base substrate 100. In an exemplary embodiment, the base substrate 100 may include a display region I and a wiring region II.

The barrier layer 105 may be formed of, e.g., silicon oxide, silicon nitride, and/or silicon oxynitride. For example, a silicon oxide layer and a silicon nitride layer may be stacked to form the barrier layer 105.

The barrier layer 105 may be formed by at least one of, e.g., a chemical vapor deposition (CVD) process, a plasma enhanced chemical vapor deposition (PECVD) process, a high density plasma-chemical vapor deposition (HDP-CVD) process, a thermal evaporation process, a vacuum evaporation process, a spin coating process, a sputtering process, and an atomic layer deposition (ALD) process.

In some embodiments, the formation of the barrier layer 105 may be omitted.

Figure 3:
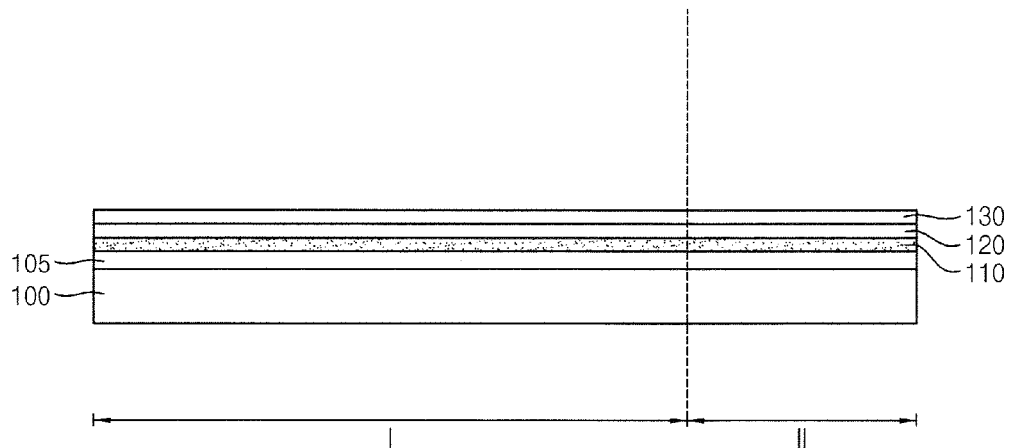

Referring to FIG. 3, a dummy layer 110, a buffer layer 120, and an active layer 130 may be sequentially formed on the barrier layer 105.

In some embodiments, the dummy layer 110 may be formed of a silicon compound such as amorphous silicon or polysilicon, or a semiconductor material. In some embodiments, the dummy layer 110 may be formed using a metal such as Cu, Ti, W, Al, or the like.

The buffer layer 120 may be formed of silicon oxide, silicon nitride, and/or silicon oxynitride. In some embodiments, the buffer layer 120 may be formed as a single-layered structure including one of a silicon oxide layer, a silicon nitride layer, and a silicon oxynitride layer. In some embodiments, the buffer layer 120 may be formed as a multi-layered structure including at least two of the silicon oxide layer, the silicon nitride layer, and the silicon oxynitride layer.

The active layer 130 may be formed of an oxide semiconductor. For example, the active layer 130 may be formed of IGZO, ZTO, ITZO, or the like.

In an exemplary embodiment, the dummy layer 110 may have a lower transmittance and a higher reflectivity than those of the active layer 130.

The dummy layer 110, the buffer layer 120, and the active layer 130 may be formed by, e.g., a sputtering process, an ALD process, a CVD process, a PECVD process, an HDP-CVD process, a thermal evaporation process, a vacuum evaporation process, or the like.

Figure 4:
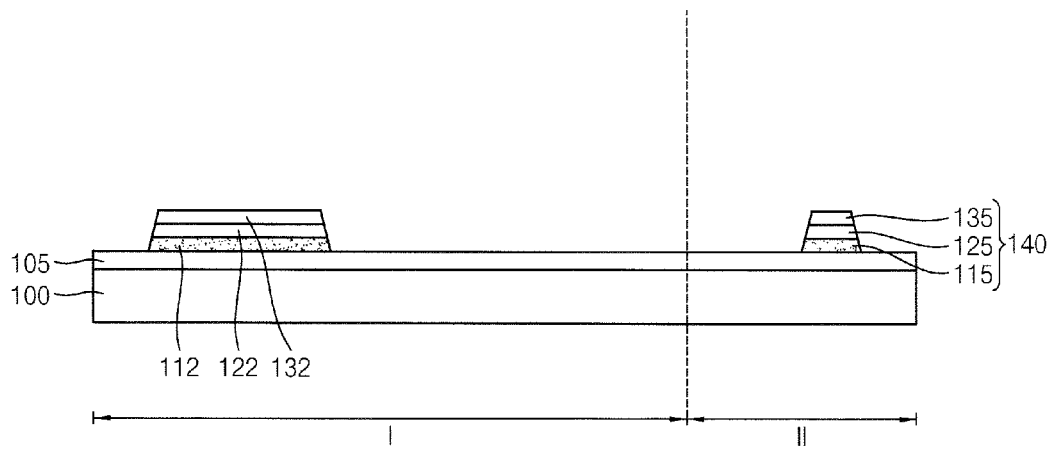

Referring to FIG. 4, the active layer 130, the buffer layer 120, and the dummy layer 110 may be partially etched. Accordingly, a first dummy pattern 112, a first buffer layer pattern 122, and an active pattern 132 sequentially stacked on a top surface of the barrier layer 105 may be formed on the display region I. An alignment pattern 140 including a second dummy pattern 115, a second buffer layer pattern 125, and a dummy active pattern 135 sequentially stacked on the barrier layer 105 may be formed on the wiring region II.

In an exemplary embodiment, the etching process for the active layer 130, the buffer layer 120, and the dummy layer 110 may include a first photo process which may be a photo-lithography process using a first photo-mask.

For example, the first photo-mask may be located over the active layer 130, and the active layer 130, the buffer layer 120, and the dummy layer 110 may be sequentially etched by the first photo process. The etching process may include a wet etching process and/or a dry etching process.

In some embodiments, the active layer 130, the buffer layer 120, and the dummy layer 110 may be etched by a substantially single etching process.

In some embodiments, the active layer 130, the buffer layer 120, and the dummy layer 110 may be etched by a two-step etching process (e.g., one photo/two-step etching process). For example, the active layer 130 may be etched in advance to form the active pattern 132 and the dummy active pattern 135. Subsequently, the buffer layer 120 and the dummy layer 110 may be etched using the active pattern 132 and the dummy active pattern 135 as an etching mask to form the first and second buffer layer patterns 122 and 125, and the first and second dummy patterns 112 and 115.

According to an exemplary embodiment, the alignment pattern 140 may be formed on the wiring region II by the first photo process. The alignment pattern 140 may serve as, e.g., an align-key for subsequent photo or etching processes.

The alignment pattern 140 may be formed by the first photo process together with the active pattern 132. Thus, an additional photo process for the formation of the alignment pattern 140 may be omitted.

As described above, if the active pattern 132 or the active layer 130 includes the oxide semiconductor, an alignment pattern or an align-key may not be achieved solely from the dummy active pattern 135 due to a high transmittance thereof.

Accordingly, in a comparative embodiment, a metal layer may be formed before a formation of an active pattern including the oxide semiconductor on the display region I, and then the metal layer may be etched to form an alignment pattern including a metal on the wiring region II. An insulation layer covering the alignment pattern may be formed, and the active pattern may be formed on the insulation layer.

According to the comparative embodiment, a photo process is added for the formation of the alignment pattern, resulting in an increased process time and process cost.

However, according to an exemplary embodiment, the dummy layer 110 and the buffer layer 120 may be formed before the formation of the active layer 130. The active layer 130, the buffer layer 120 and the dummy layer 110 may be etched by a single photo process, e.g., the first photo process. Thus, the alignment pattern 140 may be formed substantially together with the active pattern 132. Therefore, the additional photo process for the alignment pattern 140 may be skipped so that processing time and cost may be reduced.

The second dummy pattern 115 included in the alignment pattern 140 may include a metal or a silicon-based semiconductor material, and thus may have a lower transmittance or a higher reflectivity that those of the active pattern 132 and the dummy active pattern 135. Thus, the alignment pattern 140 may serve as the align-key.

Figure 5:
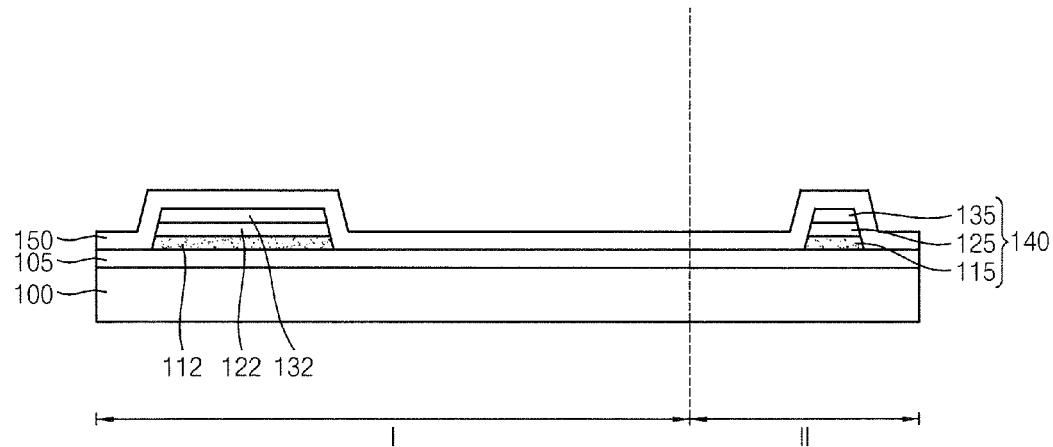

Referring to FIG. 5, a gate insulation layer 150 covering the active pattern 132 and the alignment pattern 140 may be formed on the barrier layer 105.

The gate insulation layer 150 may be formed of, e.g., silicon oxide, silicon nitride, and/or silicon oxynitride. The gate insulation layer 150 may be formed as a single-layered structure, or a multi-layered structure including, e.g., a silicon oxide layer and a silicon nitride layer. The gate insulation layer 150 may be formed by a CVD process, an ALD process, a sputtering process, etc.

Figure 6:
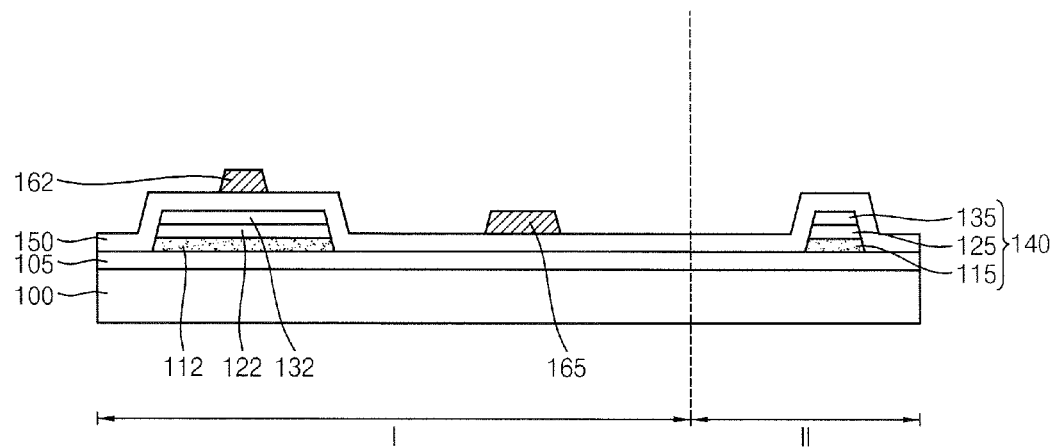

Referring to FIG. 6, a gate electrode 162 and a lower electrode 165 may be formed on the gate insulation layer 150.

In an exemplary embodiment, a gate electrode layer may be formed on the gate insulation layer 150. A second photo-mask may be aligned over the gate electrode layer, and the gate electrode layer may be partially removed by a second photo process using the second photo-mask as an etching mask to form the gate electrode 162 and the lower electrode 165.

The second photo-mask may be aligned using the alignment pattern 140 as an align-key. Thus, an accuracy of the second photo process may be improved so that the gate electrode 162 and the lower electrode 165 may be formed on predetermined positions.

As illustrated in FIG. 6, the gate electrode 162 may be superimposed over a substantially central portion of the active pattern 132. The lower electrode 165 may be formed on a portion of the gate insulation layer 150 on the display region I which may not cover the active pattern 132.

The gate electrode layer may be formed of a metal such as Ag, W, Cu, Ni, Cr, Mo, Ti, Pt, Ta, Nd or Sc, an alloy, or a metal nitride. In some embodiments, a plurality of metal layers may be stacked to form the gate electrode layer. The gate electrode layer may be formed by, e.g., a sputtering process or an ALD process.

In some embodiments, the gate electrode 162 may be formed simultaneously with a scan line. For example, the gate electrode 162, the lower electrode 165 and the scan line may be formed from the gate electrode layer by the second photo process.

Figure 7:
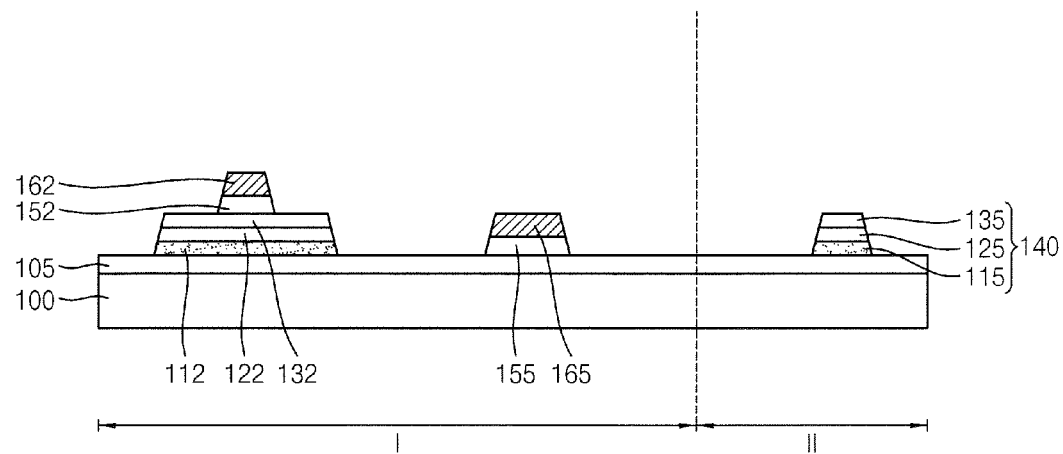

Referring to FIG. 7, the gate insulation layer 150 may be partially etched using the gate electrode 162 and the lower electrode 165 as an etching mask.

Accordingly, a gate insulation layer pattern 152 may be formed between the gate electrode 162 and the active pattern 132, and an insulation pattern 155 may be formed between the lower electrode 165 and the barrier layer 105. After the formation of the gate insulation layer pattern 152, the central portion of the active pattern 132 may be substantially covered by the gate insulation layer pattern 152 and the gate electrode 162, and a peripheral portion or both ends of the active pattern 132 may be exposed.

Figure 8:
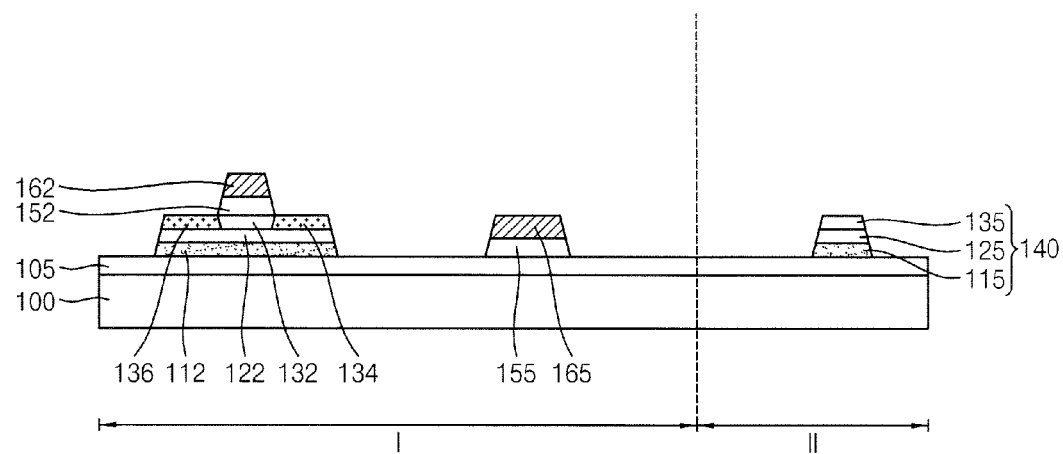

Referring to FIG. 8, hydrogen ions or a hydrogen gas may be implanted at the peripheral portion or the both ends of the active pattern 132 using the gate electrode 162 as a doping mask. Accordingly, a first contact region 134 and a second contact region 136 having an improved electrical conductivity relatively to the central portion of the active pattern 132 may be formed.

For example, the first contact region 134 and the second contact region 136 may serve as a source region and a drain region, respectively. The central portion of the active pattern 132 may serve as a channel region through which charges are moved or transferred.

Accordingly, a TFT including the active pattern 132, the contact regions 134 and 136, the gate insulation layer pattern 152, and the gate electrode 162 may be formed on the display region I.

Figure 9:
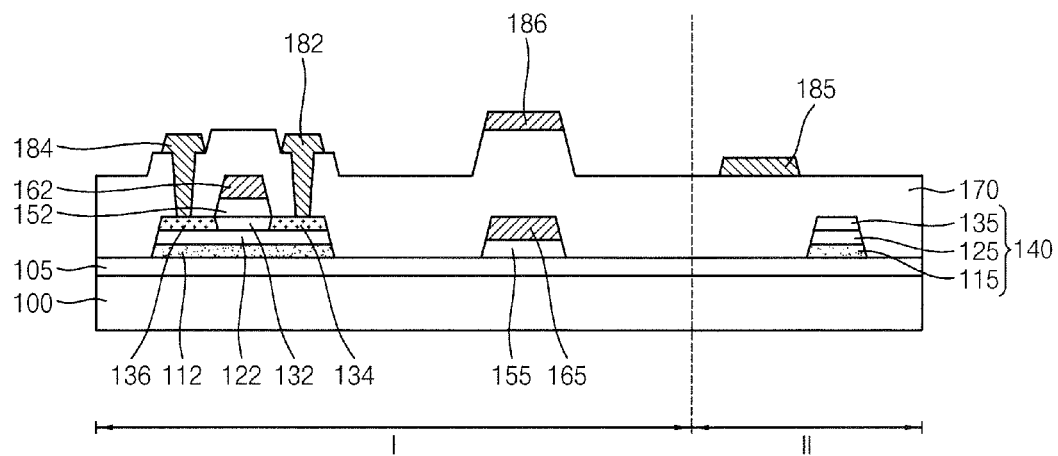

Referring to FIG. 9, an insulating interlayer 170 covering the TFT, the lower electrode 165 and the alignment pattern 140 may be formed on the barrier layer 105. The insulating interlayer 170 may be formed commonly and continuously on the display region I and the wiring region II.

The insulating interlayer 170 may be formed of silicon oxide, silicon nitride, and/or silicon oxynitride. In some embodiments, the insulating interlayer 170 may be formed by stacking a silicon oxide layer and a silicon nitride layer. The insulating interlayer 170 may be formed by a CVD process, an ALD process, a sputtering process, etc.

The insulating interlayer 170 may include protrusions according to profiles of the contact regions 134 and 136, the gate electrode 162, and the lower electrode 165. In some embodiments, the insulating interlayer 170 may have a sufficient thickness to have a substantially leveled top surface.

A source electrode 182, a drain electrode 184, an upper electrode 186, and a pad 185 may be formed on the insulating interlayer 170.

In an exemplary embodiment, the insulating interlayer 170 may be partially etched to form contact holes through which the first and second contact regions 134 and 136 may be exposed. For example, a third photo-mask may be located on the insulating interlayer 170, and a third photo process may be performed on the insulating interlayer 170 to form the contact holes. In the third photo process, the alignment pattern 140 may be utilized as an align-key, and thus a mis-alignment of the contact holes may be prevented.

A first conductive layer filling the contact holes may be formed on the insulating interlayer 170, and then the first conductive layer may be partially etched to form the source electrode 182, the drain electrode 184, the upper electrode 186 and the pad 185.

In an exemplary embodiment, a fourth photo-mask may be located on the first conductive layer, and a fourth photo process may be performed on the first conductive layer. In the fourth photo process, the alignment pattern 140 may be utilized as an align-key, and thus the source electrode 182, the drain electrode 184, the upper electrode 186, and the pad 185 may be formed on predetermined positions without causing an mis-alignment.

The source electrode 182 and the drain electrode 184 may fill the contact holes to be electrically connected to the first contact region 134 and the second contact region 136, respectively. A switching device including the TFT, the source electrode 182 and the drain electrode 184 may be defined.

The upper electrode 186 may be substantially superimposed over the lower electrode 165. A capacitor may be defined by the lower electrode 165, the insulating interlayer 170 and the upper electrode 186.

The pad 185 may be formed on a portion of the insulating interlayer 170 on the wiring region II.

In some embodiments, a data line may be electrically connected to or integral with the source electrode 182. In this case, the data line may be formed from the first conductive layer together with the source electrode 182, the drain electrode 184, the upper electrode 186, and the pad 185 by the fourth photo process.

Figure 10:
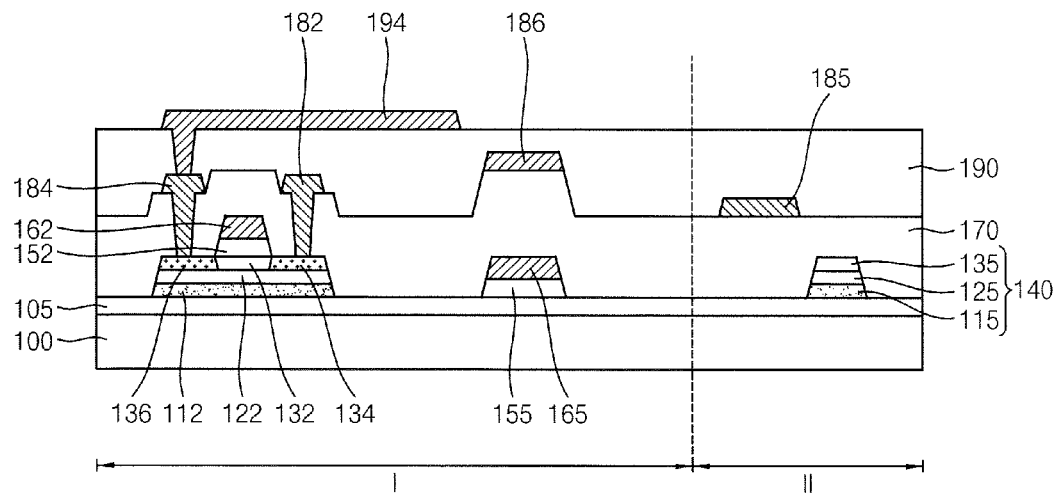

Referring to FIG. 10, a via insulation layer 190 covering the source electrode 182, the drain electrode 184, the upper electrode 186, and the pad 185 may be formed on the insulating interlayer 170.

The via insulation layer 190 may be formed using a transparent organic material such as polyimide, an epoxy-based resin, an acryl-based resin or a polyester-based resin. The via insulation layer 190 may have a sufficient thickness to have a substantially leveled top surface. The via insulation layer 190 may be formed by, e.g., a spin coating process, a thermal evaporation process, or a printing process.

A pixel electrode 194 electrically connected to the switching device may be formed on a portion of the via insulation layer 190 on the display region I.

For example, the via insulation layer 190 may be partially etched to form a via hole through which the drain electrode 184 may be exposed. In some embodiments, a fifth photo-mask may be aligned over the via insulation layer 190, and a fifth photo process may be performed on the via insulation layer 190 using the fifth photo-mask to form the via hole. In the fifth photo process, the alignment pattern 140 may be referenced as an align-key. Thus, a mis-alignment of the via hole may be prevented.

A second conductive layer filling the via hole may be formed on the via insulation layer 190, and may be patterned to form the pixel electrode 194. For example, a pixel may be defined at each intersection region of the data and scan lines on the display region I. The pixel electrode 194 may be provided per each pixel.

The second conductive layer may be formed using a metal, a metal nitride, and/or an alloy by, e.g., a sputtering process, an ALD process, a CVD process, etc. In some embodiments, the second conductive layer may be formed of a transparent conductive material such as ITO, IZO, zinc oxide, or indium oxide.

Figure 11:
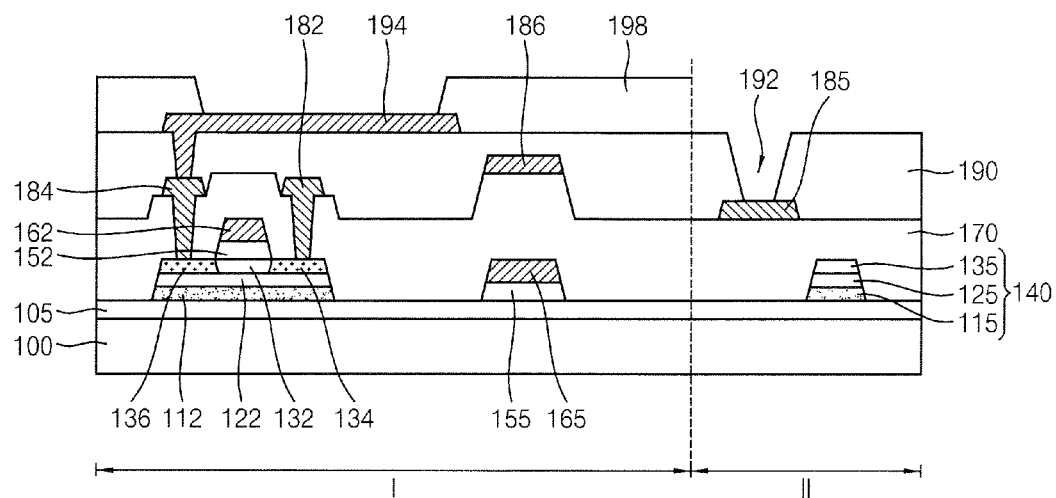

Referring to FIG. 11, a PDL 198 may be formed on a portion of the via insulation layer 190 of the display region I. The PDL 198 may cover a peripheral portion of the pixel electrode 194, and thus a top surface of the pixel electrode 194 may be partially exposed.

For example, a photosensitive organic material including, e.g., a polyimide-based resin or an acryl-based resin may be coated on the via insulation layer 190, and then exposure and developing processes may be performed to form the PDL 198. In some embodiments, the alignment pattern 140 may be also referenced for aligning an exposure mask used in the exposure process.

In some embodiments, a portion of the via insulation layer 190 on the wiring region II may be partially etched to form an interconnection hole 192 through which a top surface of the pad 185 may be at least partially exposed. In a photo-lithography process for the formation of the interconnection hole 192, the alignment pattern may be utilized as an align-key.

According to an exemplary embodiment described above, the alignment pattern 140 having a multi-stacked structure may be formed together with the active pattern 132 by, e.g., the first photo process. The alignment pattern 140 may be utilized as the align-key while performing subsequent etching processes (e.g., the second to fifth photo processes). Therefore, the number of entire photo processes may be decreased, and a mis-alignment of patterns may be prevented.

Figure 12:
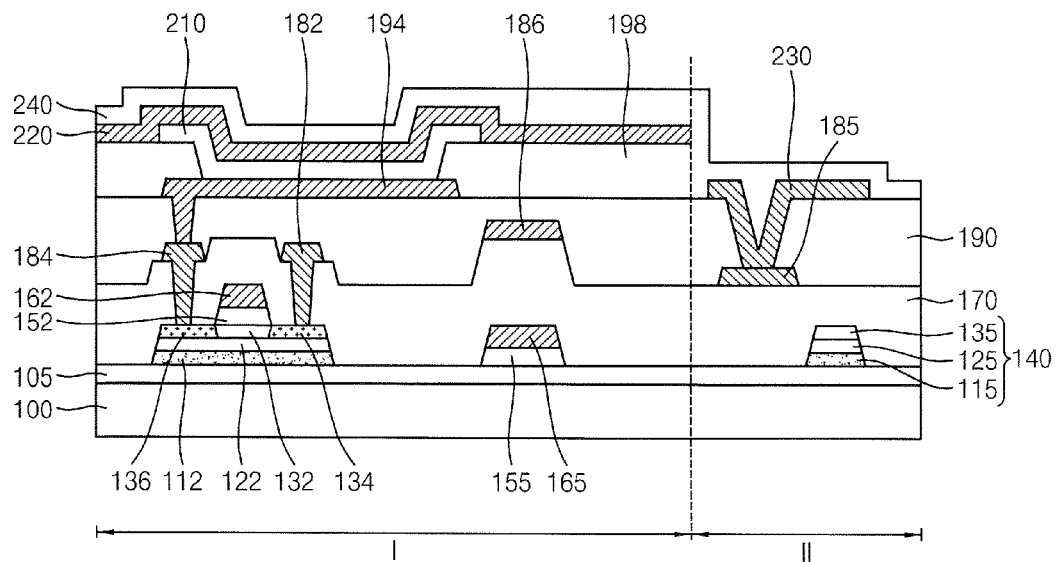
FIG. 12 is a cross-sectional view illustrating a display device in accordance with an exemplary embodiment.

FIG. 12 is a cross-sectional view illustrating a display device in accordance with an exemplary embodiment. FIG. 12 illustrates an OLED device including, e.g., the display substrate of FIG. 1.

Thus, detailed descriptions on elements and/or constructions substantially the same as or similar to those illustrated with reference to FIG. 1 are omitted herein, and like reference numerals are used to designate like elements.

Referring to FIG. 12, the display device may include the display substrate of FIG. 1 as a back-plane substrate, and may include a display layer 210, an opposing electrode 220 and an encapsulation film 240. The display device may further include a wiring 230 electrically connected to the pad 185 on the wiring region II.

The display layer 210 may include an organic emitting layer patterned individually for a red pixel Pr, a green pixel Pg and a blue pixel Pb to generate a different color at each pixel. The organic emitting layer may include a host material excited by holes and electrons, and a dopant material facilitating an emitting efficiency through absorbing and releasing energy.

In some embodiments, the display layer 210 may further include a hole transport layer (HTL) between the pixel electrode 194 and the organic emitting layer. The display layer 210 may further include an electron transport layer (ETL) between the opposing electrode 220 and the organic emitting layer.

The HTL may include a hole transport material, e.g., 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole, or a combination thereof.

The ETL may include an electron transport material, e.g., tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), triazole (TAZ), phenylquinozaline, or a combination thereof.

In some embodiments, the display layer 210 may include a liquid crystal layer instead of the organic emitting layer. In this case, the display device may be provided as an LCD device.

The display layer 210, as illustrated in FIG. 12, may be formed on a sidewall of the PDL 198, and a top surface of the pixel electrode 194 exposed by the PDL 198. The display layer 210 may be also extended on a top surface of the PDL 198. In some embodiments, the display layer 210 may be confined by the sidewall of the PDL 198, and may be individually provided per each pixel.

In some embodiments, the HTL and the ETL included in the display layer 210 may be provided commonly and continuously on a plurality of the pixels.

The display layer 210 may be formed by, e.g., a spin coating process, a roll printing process, a nozzle printing process, an inkjet printing process, a transfer process using a donor substrate, etc.

The opposing electrode 220 may be formed on the PDL 198 and the display layer 210. The opposing electrode 220 may face the pixel electrode 194 with respect to the display layer 210.

In some embodiments, the opposing electrode 220 may serve as a common electrode commonly provided for the plurality of the pixels. The pixel electrode 194 and the opposing electrode 220 may serve as an anode and a cathode, respectively, of the display device.

The opposing electrode 220 may be formed using a metal such ads Al, Ag, W, Cu, Ni, Cr, Mo, Ti, Pt, Ta, Nd or Sc, or an alloy thereof by, e.g., a sputtering process or an ALD process.

As illustrated in FIG. 12. The opposing electrode 220 may be formed selectively on the display region I, and may not extend on the wiring region II.

The wiring 230 may be formed on a portion of the via insulation layer 190 on the wiring region II. The wiring 230 may be formed on an inner wall of the interconnection hole 192 (see FIG. 11) formed in the via insulation layer 190, and may be electrically connected to or in contact with the pad 185.

In some embodiments, the wiring 230 may be simultaneously formed with the opposing electrode 220 from the same conductive layer.

For example, the wiring 230 may serve as a data wiring, a source wiring, or the like. In some embodiments, the wiring 230 may serve as an interconnection structure electrically connected to an external power source for supplying a driving voltage of the display device.

The encapsulation film 240 may be formed of an inorganic material such as silicon oxynitride, silicon nitride, and/or a metal oxide. The encapsulation layer 240 may be formed commonly and continuously on the display region I and the wiring region II. The encapsulation layer 240 may be formed by, e.g., a CVD process, an ALD process, a spin coating process, etc.

In an embodiment, a capping layer including an organic material such as a polyimide-based resin, an epoxy-based resin, or an acryl-based resin, or an inorganic material such as silicon oxide, silicon nitride, or silicon oxynitride may be formed before the formation of the encapsulation layer 240.

According to exemplary embodiments, a dummy layer and a buffer layer may be formed before forming an active layer, and the active layer, the buffer layer, and the dummy layer may be etched by a single photo process. Thus, an active pattern and an alignment pattern may be formed together. Thus, an additional photo process for a formation of the alignment pattern may be omitted so that a process cost and a process time may be reduced. Further, if a TFT including a transparent oxide semiconductor is disposed in a display substrate, a composition of the dummy layer may be properly selected so that a transmittance of the alignment pattern may be controlled.

In exemplary embodiments, the upper pattern may include an oxide semiconductor, and the lower pattern may include a silicon compound or a metal. The alignment pattern may further include a buffer layer pattern between the upper pattern and the lower pattern. The buffer layer pattern may include an insulative material.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a display substrate, comprising:
    providing a base substrate comprising a first region and a second region;
    forming a dummy layer, a buffer layer, and an active layer sequentially on the base substrate;
    partially etching the active layer, the buffer layer, and the dummy layer such that a first dummy pattern, a first buffer layer pattern, and an active pattern sequentially stacked on the base substrate are formed on the first region, and a second dummy pattern, a second buffer layer pattern, and a dummy active pattern sequentially stacked on the base substrate are formed on the second region;
    forming a gate insulation layer covering the active pattern and the dummy active pattern on the base substrate;
    forming a gate electrode which is superimposed over the active pattern on the gate insulation layer;
    partially etching the gate insulation layer using the gate electrode as an etching mask;
    forming an insulating interlayer covering the gate electrode and the dummy active pattern on the base substrate; and
    forming a source electrode and a drain electrode electrically connected to the active pattern through the insulating interlayer.

2. The method of claim 1, wherein the dummy layer is formed of a silicon compound or a metal, the buffer layer is formed of an insulative material, and the active layer is formed of an oxide semiconductor.

3. The method of claim 1, wherein a stacked structure including the second dummy pattern, the second buffer layer pattern, and the dummy active pattern serves as an alignment pattern.

4. The method of claim 3, wherein the alignment pattern is used as a reference for at least one of the forming the gate electrode and the forming the source electrode and the drain electrode.

* * * * *